(12) United States Patent
Liu et al.

(10) Patent No.: US 12,073,667 B2
(45) Date of Patent: Aug. 27, 2024

(54) METHOD AND DEVICE FOR MUTUAL MONITORING AND/OR CONTROL OF AUTONOMOUS TECHNICAL SYSTEMS

(71) Applicant: Robert Bosch GmbH, Stuttgart (DE)

(72) Inventors: Ziyuan Liu, Munich (DE); Philine Meister, Sunnyvale, CA (US); Amer Mesanovic, Munich (DE); Michael Fiegert, Munich (DE); Daniel Meyer-Delius Di Vasto, Munich (DE); Andrei Szabo, Ottobrunn (DE); Kai Wurm, Munich (DE); Vincent Dietrich, Munich (DE)

(73) Assignee: ROBERT BOSCH GMBH, Stuttgart (DE)

( * ) Notice: Subject to any disclaimer, the term of this patent is extended or adjusted under 35 U.S.C. 154(b) by 854 days.

(21) Appl. No.: 17/252,861

(22) PCT Filed: Jun. 5, 2019

(86) PCT No.: PCT/EP2019/064647
§ 371 (c)(1),
(2) Date: Dec. 16, 2020

(87) PCT Pub. No.: WO2019/243052
PCT Pub. Date: Dec. 26, 2019

(65) Prior Publication Data
US 2021/0158635 A1    May 27, 2021

(30) Foreign Application Priority Data

Jun. 19, 2018 (DE) .................... 10 2018 209 868.9

(51) Int. Cl.
*G07C 5/08* (2006.01)
*B60W 60/00* (2020.01)
(Continued)

(52) U.S. Cl.
CPC ......... *G07C 5/0816* (2013.01); *B60W 60/001* (2020.02); *G06F 30/15* (2020.01); *G07C 5/008* (2013.01); *G07C 5/085* (2013.01)

(58) Field of Classification Search
CPC ...... G07C 5/0816; G07C 5/008; G07C 5/085; G06F 30/15; B60W 60/001
See application file for complete search history.

(56) References Cited

U.S. PATENT DOCUMENTS 6,292,725 B1 * 9/2001 Kageyama .............. G01S 19/49
    180/169
6,393,362 B1 * 5/2002 Burns .................. G05D 1/0297
    701/119

(Continued)

FOREIGN PATENT DOCUMENTS

DE    102016007588 A1    2/2017
DE    102015122212 B3    5/2017

(Continued)

OTHER PUBLICATIONS

PCT International Search Report and Written Opinion of International Searching Authority mailed Oct. 10, 2019 corresponding to PCT International Application No. PCT/EP2019/064647 filed May 6, 2019.

(Continued)

*Primary Examiner* — Kenneth J Malkowski
*Assistant Examiner* — Carville Albert Hollingsworth, IV
(74) *Attorney, Agent, or Firm* — NORTON ROSE FULBRIGHT US LLP; Gerard A. Messina

(57) ABSTRACT

A method and a device for the mutual monitoring and/or control of a multiplicity of autonomous technical systems which are at least partially interconnected to one another via a communication network is provided. At least one of the autonomous technical systems is embodied as a monitoring autonomous technical system and monitors the operating (Continued)

behaviour of other autonomous technical systems. Since a specified first rule, the monitoring autonomous technical system detects an operating behavior, which is contrary to the rule, of a first autonomous technical system and generates a status message about the operating behavior which is contrary to the rule therefrom. Depending on the evaluation, a control rule is derived for the first autonomous technical system and communicated to a control module which is assigned to the first autonomous technical system. The operating behavior of the first autonomous technical system is controlled on the basis of the control rule.

16 Claims, 3 Drawing Sheets

(51) Int. Cl.
   *G06F 30/15* (2020.01)
   *G07C 5/00* (2006.01)

(56) References Cited

U.S. PATENT DOCUMENTS

| | | |
|---|---|---|
| 8,344,864 B1 | 1/2013 | Al-Mutawa |
| 10,131,053 B1* | 11/2018 | Sampedro ............ B25J 9/1666 |
| 11,429,111 B2* | 8/2022 | Medeiros ............. G06T 7/277 |
| 2017/0227972 A1 | 8/2017 | Sabau |
| 2017/0329956 A1* | 11/2017 | Lu ....................... H04L 9/3234 |

FOREIGN PATENT DOCUMENTS

| | | |
|---|---|---|
| WO | 2017035516 A1 | 3/2017 |
| WO | 2018035145 A1 | 2/2019 |

OTHER PUBLICATIONS

Non-English European Search Report for Application No. 10 2018 209 868.9, dated Apr. 9, 2019.

* cited by examiner

METHOD AND DEVICE FOR MUTUAL MONITORING AND/OR CONTROL OF AUTONOMOUS TECHNICAL SYSTEMS

CROSS-REFERENCE TO RELATED APPLICATIONS

This application claims priority to PCT Application No. PCT/EP2019/064647, having a filing date of Jun. 5, 2019, which is based off of DE Application No. 10 2018 209 868.9, having a filing date of Jun. 19, 2018, the entire contents both of which are hereby incorporated by reference.

FIELD OF TECHNOLOGY

The following relates to a method and a device for mutual monitoring and/or control of a plurality of autonomous technical systems, which are at least partly interconnected via a communication network.

BACKGROUND

Autonomous technical systems can, for example, be understood to mean autonomous vehicles, devices or robots, which can move autonomously or operate automatically, for instance. Autonomous technical systems can increasingly be used in various domains. System faults, such as software or hardware faults or malfunctions due to tampering may, in this case, have serious consequences for the security of the autonomous technical systems themselves and/or people and technical systems in their vicinity. It is known to implement security mechanisms on an autonomous device or in an autonomous vehicle. Examples here include physical security measures, such as disconnection of a radio link to a controller, digital security measures, such as authentication for functional access, intrinsic detection of a fault, separate security circuits or monitoring systems, such as by external sensors. However, a full control can often not be guaranteed, in particular if there is just one security mechanism for an autonomous technical system which could itself be faulty or can easily be tampered with.

SUMMARY

An aspect relates to provide a possibility to improve the security of an autonomous technical system and/or of a plurality of autonomous technical systems.

A first aspect of embodiments of the invention relates to a method for mutual monitoring and/or control of a plurality of autonomous technical systems, which are at least partly interconnected via a communication network, wherein:
- at least one of the autonomous technical systems is designed as a monitoring autonomous technical system and monitors the operating behavior of other autonomous technical systems,
- abnormal operating behavior of a first autonomous technical system is detected by the monitoring autonomous technical system based on a specified first rule and a status message regarding the abnormal operating behavior of the first autonomous technical system is generated therefrom,
- the status message is transmitted from the monitoring autonomous technical system to some of the other autonomous technical systems,
- the status message is received by some of the other autonomous technical systems and jointly evaluated by them and, depending on the evaluation, a control rule is derived for the first autonomous technical system, and the control rule is sent to a control module, which is assigned to the first autonomous technical system, and the operating behavior of the first autonomous technical system is controlled by the control module according to the control rule.

One advantage of embodiments of the invention is, for example, that in particular different autonomous technical systems can monitor each other, and when one of the autonomous technical systems exhibits abnormal behavior, this can be controlled. A joint evaluation of the operating behavior means that an autonomous technical system can be put into a safe state in the case of abnormal operating behavior. In particular, a control of an autonomous technical system can be carried out by other autonomous technical systems externally and only after joint examination and evaluation of a status message regarding the abnormal operating behavior.

An evaluation can be made based on collected or received data, such as status information or a measurement result. The evaluation can in particular be dependent on a specified first rule, such as a speed limit. An autonomous technical system can, for example, use the first rule and the received status message to evaluate or decide whether abnormal operating behavior, which was detected by a monitoring autonomous technical system dependent on the first rule, should be controlled.

The plurality of autonomous technical systems is interconnected via a communication network. They can communicate with each other, for example, via an existing data and/or communication network. The autonomous technical systems can also establish an adhoc communication network amongst themselves. In particular, a joint evaluation of participating autonomous technical systems can be established via the communication network. For example, as soon as the joint evaluation indicates a value that, for example, exceeds a predetermined value, a control rule for controlling a technical system behaving abnormally can be determined and sent to its control module. In particular, the joint evaluation and/or coordination can be designed as a decentralized method. A decentralized method is also advantageous as it can be flexibly adapted to the technical systems involved in the evaluation method.

For example, an autonomous vehicle can be stopped if a speed limit is exceeded following joint evaluation of the status message of the abnormal operating behavior by at least some of the other autonomous technical systems. For this purpose, a status message regarding the abnormal operating behavior of the autonomous vehicle can be shared with other autonomous technical systems via the communication network and evaluated by them. The method according to embodiments of the invention can in particular make it possible to put one of the autonomous technical systems into a safe state after an abnormal operating mode has been detected by at least one other autonomous technical system and the status message regarding the abnormal operating behavior has been evaluated by at least one other autonomous technical system.

The plurality of autonomous technical systems can in particular monitor each other, evaluate each other's operating behavior and, on this basis, jointly arrange a control if one of the autonomous technical systems is behaving abnormally. Moreover, only some of the autonomous technical systems may be equipped with a control module or a control module may be assigned to each of them, for instance. It is also conceivable that a control module is arranged externally and is assigned to at least one autonomous technical system, such as a retractable bollard.

A control mechanism according to embodiments of the invention can be implemented in addition to security systems already in place. A control module can be integrated in an autonomous technical system and configured such that an externally transmitted control rule can be directly implemented and/or valid control commands can be overwritten, modified or overridden. A control rule may, for example, comprise a command to switch off and/or restrict a function. In particular, the control module can only implement one control rule according to the predefined rules, such as just reducing but not increasing a speed.

A further advantage of embodiments of the invention can, for example, be seen in the controlled monitoring and control, as false reports about operating behavior can be detected by joint evaluation of a status message, for instance. This can, for example, also prevent the monitoring autonomous technical system from being able to enforce the control of the autonomous technical system behaving abnormally on its own, e.g. if this monitoring autonomous technical system is itself defective or has been tampered with.

In one advantageous embodiment of the method, a monitoring autonomous technical system can comprise at least one sensor, the sensor can record sensor data, and abnormal operating behavior of one of the other autonomous technical systems can be detected using the sensor data.

A sensor may, for example, be a camera in different spectral wavelength ranges, a temperature sensor, a speedometer or accelerometer, a distance measuring apparatus, a laser scanner, a radar or ultrasonic sensor or a microphone. A monitoring autonomous technical system comprises sensors with different spatial resolutions and at different positions, so that, for example, when the monitoring autonomous system moves, the operating behavior of another autonomous system can be monitored without interruption.

In a further advantageous embodiment of the method, the status message can be transmitted and/or the status message can be jointly evaluated and/or the control rule can be sent by means of encrypted data transmission via the communication network and/or after mutual identification of the autonomous technical systems.

In particular, a status message can be transmitted to at least some of the other autonomous technical systems and/or the status message can be jointly evaluated via a secure data connection and/or after mutual identification of the communication partners. By way of example, a status message can be sent cryptographically protected. Similarly, a control rule can be sent cryptographically encrypted to a control module via the communication network and only decrypted there. A cryptographically encrypted data transmission can in particular prevent tampering. For secure communication, the participating autonomous technical systems can in particular identify and, if necessary, authenticate each other.

In a further advantageous embodiment of the method, several autonomous technical systems can be designed as monitoring autonomous technical systems and each of these monitoring autonomous systems can transmit a status message to other autonomous technical systems and the status messages can be jointly evaluated.

In particular, monitoring and/or evaluation can only be carried out by some of the autonomous technical systems. The autonomous technical systems can in particular monitor and control each other. Some of the monitoring systems can also comprise a control module. Each of the monitoring autonomous technical systems can in particular generate its own status message and share this with the other autonomous technical systems via the communication network. In order to be able to derive a control rule for an abnormally behaving system, an evaluation of all of the status messages on its operating behavior shared among each other via the communication network can be jointly evaluated. There can, for example, be a majority decision on the status messages.

In a further advantageous embodiment of the method, the monitoring and/or the evaluation of a status message and/or the control according to a control rule of at least one autonomous technical system can be carried out continuously and/or at predetermined times.

It can be advantageous that, for example, the monitoring is carried out by at least one monitoring autonomous technical system continuously and/or at predetermined times. By way of example, one of the autonomous technical systems can be monitored by several alternating other autonomous technical systems alternately observing its operating behavior. A check of an operating status and/or operating behavior of an autonomous technical system that is uninterrupted and/or required at predetermined times can thus be achieved, for example. As soon as abnormal operating behavior is detected, a status message regarding this can be generated and jointly evaluated. In particular, continuous monitoring by different autonomous technical systems can facilitate the evaluation of a status message if a large amount of data from sensors is available for the evaluation.

In a further advantageous embodiment of the method, a weighting can be assigned to each autonomous technical system that evaluates a status message and thus the joint evaluation of a status message can be determined from weighted evaluations.

A single weighting may in particular indicate a proportion of a majority decision on one or several status messages. By way of example, an autonomous technical system can have a predetermined weighting, e.g. a value numeral, which can be specified by an official body. A weighting can also be determined based on a number, quality and/or position of sensors of a monitoring autonomous technical system. By way of example, a status message regarding abnormal operating behavior of an autonomous technical system, which has a higher weighting owing to a plurality of sensors, can be checked.

In a further advantageous embodiment of the method, the weighting can be dynamically adjusted depending on a monitoring quality and/or on a rank of an autonomous technical system.

Autonomous technical systems may be assigned a similar weighting, wherein, for example, following a change of status, such as due to movement, the weighting can be dynamically adjusted for one of these systems. By way of example, a monitoring quality may depend on the positioning, viewpoint or field of view of the respective sensors, wherein the monitoring quality can change when the system moves. The weighting may depend on the rank, such as a status, class, function, hierarchical level or a predetermined significance of the technical system. A dynamic adjustment of the weighting may, for example, make an evaluation more reliable. The dynamic adjustment of the weighting can be carried out by an autonomous technical system itself.

In a further advantageous embodiment of the method, a computer-aided simulation of the operating behavior of another autonomous technical system can be carried out by a monitoring autonomous technical system based on sensor data of the monitoring autonomous technical system and/or on sensor data of other monitoring autonomous technical systems and, based on the simulation, a prediction of future operating behavior can be derived and transmitted as a status message to at least some of the autonomous technical systems.

A prediction of the operating behavior of a monitored autonomous technical system can be generated based on the sensor data and by a computer-aided simulation. For this purpose, a simulation model of the environment of the monitoring autonomous technical system can be provided, for instance. An operating mode and/or situation can be simulated by current sensor data of the environment and a simulation model of the monitored autonomous system. This facilitates monitoring of the operating behavior. By way of example, speed and acceleration data can be used to extrapolate a driving manner and direction of on autonomous technical system.

In a further advantageous embodiment of the method, future, abnormal operating behavior can be detected using the computer-aided simulation and a specified second rule, a status message can be generated therefrom and this status message can be transmitted to at least some of the autonomous technical systems.

In particular, a prediction of operating behavior can be generated from a computer-aided simulation and a warning can be issued therefrom as a status message if abnormal future operating behavior is predicted. The abnormal operating behavior can be determined by a second rule, which in particular may be the same as the first rule. Following the joint evaluation of the status message, a control rule can be derived, which, for example, causes an early shut-down, in order to prevent an accident. For the simulation, a probability statement for a prediction can, for example, be generated and output. Furthermore, an alternative operating mode can be determined, for example, by a simulation and a status message generated depending thereon.

In a further advantageous embodiment of the method, in a non-autonomous technical system which is connected to the communication network,
   the operating behavior of the non-autonomous technical system can be monitored by at least one monitoring autonomous technical system and, according to a specified third rule, abnormal operating behavior of the non-autonomous technical system can be detected,
   a status message can be evaluated by at least some of the other autonomous technical systems and a control rule can be derived therefrom for the non-autonomous technical system, and
   the operating behavior of the non-autonomous technical system can be controlled by a control module, assigned to the non-autonomous technical system, by a control rule.

In particular, the communication network, via which the autonomous technical systems are interconnected, can be expanded by non-autonomous technical systems. A non-autonomous technical system may, for example, be equipped with a control module, which enables external control by a control rule evaluated by the plurality of autonomous technical systems. The plurality of monitoring autonomous technical systems can thus, for example, have external and jointly controlled access to a non-autonomous technical system if the latter is controlled abnormally. A specified third rule may in particular be similar to a specified first and/or specified second rule.

A further aspect of embodiments of the invention relates to a device for mutual monitoring and control of a plurality of autonomous technical systems, which are at least partly interconnected via a communication network, which is configured in such a manner as to carry out the steps of a method according to embodiments of the invention, comprising at least one monitoring module of an autonomous, technical system and at least one control module, which is assigned to another autonomous technical system.

It is an advantage of embodiments of the invention that autonomous technical systems are interconnected in such a manner that they can monitor each other and put each other into a safe state when a rule is breached. In particular, the device according to embodiments of the invention comprises at least one monitoring module, which is assigned to an autonomous technical system and is configured in such a manner as to monitor at least one other autonomous technical system, for example, by at least one sensor. A control module of an autonomous technical system can in particular be configured such that it receives a control rule and can control the operating behavior of the autonomous technical system according to the control rule.

In one advantageous embodiment of the device, at least some of the autonomous technical systems can be designed as monitoring autonomous technical systems, comprising respectively one monitoring module and at least one sensor, and at least some of the autonomous technical systems can respectively comprise a control module, wherein at least some of the monitoring modules and at least some of the control modules are interconnected via the communication network.

Autonomous technical systems can be equipped with a monitoring module and a control module to enable, for example, mutual monitoring and control. In particular, infrastructure sensors, such as traffic lights or barriers, can be understood as purely monitoring autonomous systems. The monitoring modules and control modules can be connected to one another via a wireless or wired communication network for joint and mutual control. A status message can thus be jointly evaluated.

In one advantageous embodiment of the device, a control module can comprise a first communication interface to the communication network for receiving and decrypting encrypted data transfer.

In particular, a control module can be designed in such a way that an encrypted control rule can only be decrypted by the control module. This can, for example, prevent a manipulation of the control rule during sending.

In one advantageous embodiment of the invention, a monitoring module can comprise an evaluation unit for evaluating a status message generated and/or received by the evaluation unit.

An evaluation unit can in particular be configured such that it can receive and evaluate a status message sent by another autonomous technical system. By way of example, the evaluation unit can evaluate a status message based on predefined evaluation criteria, such as quality of detection of an abnormal operating mode, and/or the specified first rule. The evaluation unit can in particular decide whether a control rule for controlling another autonomous system should be derived and sent to the latter. A weighting assigned to the monitoring autonomous technical system can be stored and/or dynamically adjusted in the evaluation unit. The evaluation of an evaluation unit can be provided to the other autonomous technical systems via the communication network and a joint evaluation can be derived therefrom.

In one advantageous embodiment of the device, a monitoring module can comprise a second communication interface to the communication network for encrypted data transmission and decryption of encrypted data.

In particular, a monitoring module can cryptographically encrypt a status message and transmit it to other autonomous technical systems for evaluation.

In one advantageous embodiment of the device, a monitoring module can comprise a simulation unit for simulating operating behavior of another autonomous technical system, based on sensor data of the monitoring autonomous technical system and/or on sensor data of other monitoring autonomous technical systems.

The simulation unit can in particular comprise a simulation model of the environment of the monitoring autonomous technical system, which can be adjusted by current sensor data.

Furthermore, embodiments of the invention comprise a computer program product, (non-transitory computer readable storage medium having instructions, which when executed by a processor, perform actions) which can be directly loaded into a programmable computer, comprising program code parts, which are suitable for carrying out the steps of a method according to embodiments of the invention.

BRIEF DESCRIPTION

Some of the embodiments will be described in detail, with reference to the following figures, wherein like designations denote like members, wherein.

DETAILED DESCRIPTION

Figure 1:
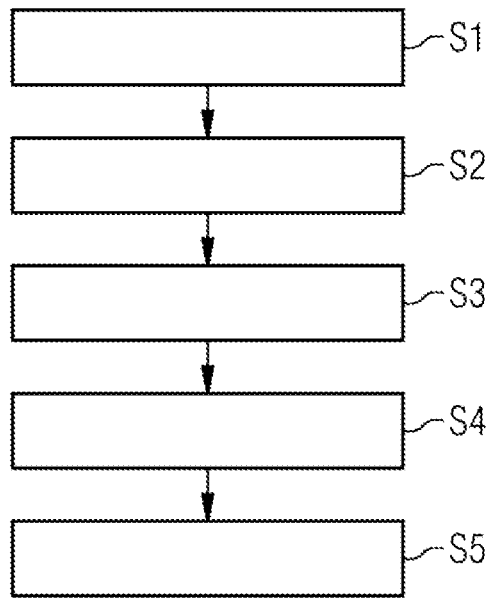
FIG. 1 shows a flow chart of a method according to an embodiment of the invention.

FIG. 1 shows a flow chart of a method according to embodiments of the invention for mutual monitoring and/or control of a plurality of autonomous technical systems, which are at least partly interconnected via a communication network. At least one of the autonomous technical systems is designed as a monitoring autonomous technical system, i.e. it comprises at least one sensor and one monitoring module for monitoring at least one of the other autonomous technical systems. The monitored autonomous technical system is equipped with a control module or a control module is assigned thereto. In particular, mutual monitoring and/or control of a plurality of autonomous technical systems can be understood as monitoring and/or control of at least one of the systems, wherein at least another of the autonomous technical systems is controlled, but, for example, can also monitor other autonomous technical systems itself.

In step S1 of the method, the monitoring autonomous technical system monitors the operating behavior of another autonomous technical system. By way of example, the monitoring autonomous technical system comprises a camera as sensor and thus records a time profile of the operating behavior, such as a speed profile, of the other autonomous technical system.

Based on a specified first rule, the monitoring autonomous technical system can check in step S2 whether the other autonomous technical system exhibits abnormal behavior, e.g. exceeds a speed limit. When the monitoring autonomous technical system detects abnormal operating behavior of the other autonomous technical system, it can generate a status message about this abnormal operating behavior. The status message can in particular be generated by the monitoring module based on the detection of the abnormal operating behavior by the sensor. The sensor transmits monitoring information to the monitoring module of the monitoring autonomous technical system. The status message may, for example, comprise identification information of the monitored autonomous technical system and details of the operating behavior.

In step S3, the status message can be transmitted by the monitoring autonomous technical system to at least some of the plurality of autonomous technical systems, which are interconnected via the communication network. In particular, only some of the autonomous technical systems can be selected as recipients of the status message. Each of the autonomous technical systems can comprise a monitoring module, wherein the monitoring module does not have to be actively switched on for monitoring, but rather can just receive status messages of other systems.

In step S4, some of the autonomous technical systems can receive and evaluate the status message. Evaluation is carried out respectively in an evaluation unit of a monitoring module. In particular, a joint evaluation of the status message based on the individual evaluations is carried out. The evaluation may, for example, be a majority decision or a weighted evaluation. A weighting is respectively assigned to an autonomous technical system. Depending on the evaluation of the status message, a control rule is derived for the first autonomous technical system. For example, a status message regarding an autonomous technical system speeding can be checked or evaluated by some of the autonomous technical systems. Depending on the check or evaluation, a control rule, such as a speed limit, can be derived therefrom.

By way of example, the control rule can be created in a monitoring module. By way of example, the control rule can be derived depending on a government agency's or manufacturer's specifications or in accordance with safety regulations.

In step S5, the control rule is transmitted via the communication network to the abnormally behaving autonomous technical system. In particular, the control rule is transmitted to a control module, which is assigned to the abnormally behaving autonomous technical system. The control rule is transmitted via the communication network of the autonomous technical systems and can, for example, be cryptographically encrypted and only decrypted in the control module. The control rule can be sent by any autonomous technical system involved in the evaluation. There is a mutual identification and/or authentication of the two autonomous technical systems prior to transmission of the control rule. The operating behavior of the first autonomous technical system can be monitored or controlled by the control module based on the control rule. The control rule can, for example, comprise a command for a braking operation, which should be carried out directly, i.e. a current control command for the autonomous technical system can, for example, be overwritten or modified by the control rule.

Figure 2:
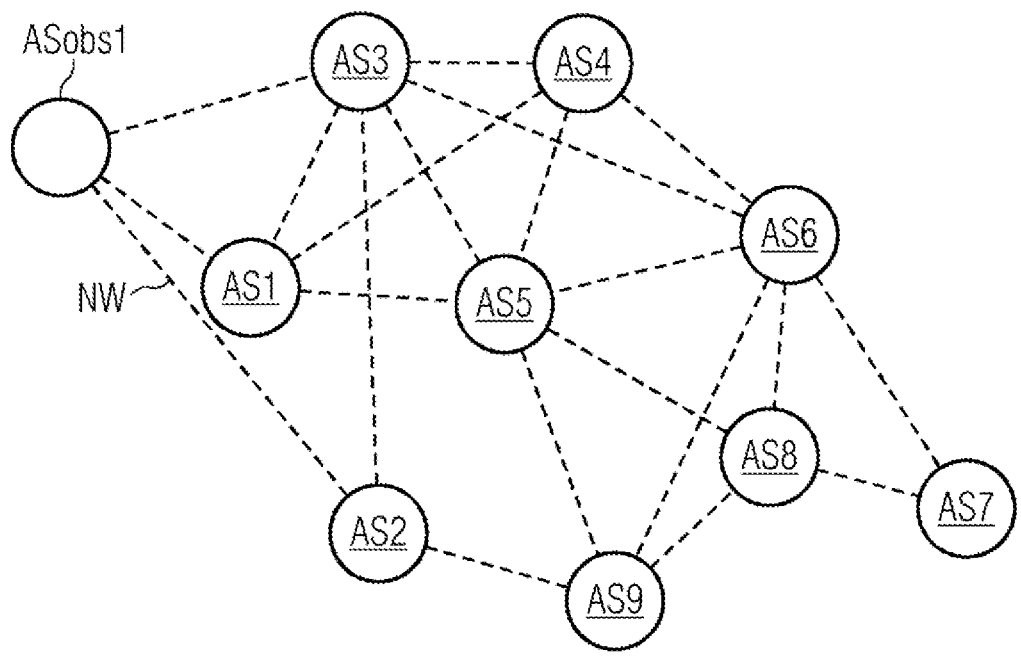
FIG. 2 shows a schematic illustration of a method according to an embodiment of the invention.

FIG. 2 shows a schematic illustration of an exemplary embodiment of the method according to embodiments of the invention and a device according to embodiments of the invention. A communication network NW is shown, which can be designed to be wireless and/or wired. A plurality of autonomous technical systems, AS1 to AS9, is interconnected via the communication network NW, wherein at least one autonomous technical system ASobs1 is designed as a monitoring autonomous technical system. In particular, the monitoring autonomous technical system ASobs1 comprises at least one sensor, which actively monitors the operating behavior of at least one of the other autonomous technical systems, AS1 to AS9, and sends sensor data to a monitoring module.

The communication network NW is intended in particular to allow the autonomous and non-autonomous technical systems to communicate with one another, such as for sending status messages for joint evaluation. The monitoring of a technical system by a monitoring autonomous technical system ASobs1 is in particular independent of a direct connection via the communication network, i.e. another technical system can in particular be monitored even if there is no direct communication connection between the monitoring and the monitored autonomous technical system.

The monitoring autonomous technical system Asobs1 can, for example, monitor the operating behavior of a first autonomous technical system AS1 and detect abnormal operating behavior based on a first rule. By way of example, a first rule comprises a speed limit, a lane limit or a limited operating radius. In particular, the first rule can be specified by an official body, such as an authority or a central control unit. The monitoring autonomous technical system Asobs1 issues a status message regarding the abnormal operating behavior of the first autonomous technical system AS1 and sends the status message to at least some of the other autonomous technical systems AS2 to AS9. The status message can also be provided to all or some of the other autonomous technical systems AS2 to AS9 via the communication network NW, such as via a server.

The status message can, for example, comprise information about abnormal operating behavior, information on the position and, possibly, information about future operating behavior, which was determined by a computer-aided simulation.

The status message is jointly evaluated by the other autonomous technical systems. In particular, only some of the other technical systems, which have received the status message, can carry out an evaluation. According to embodiments of the invention, a control rule is derived from the status message if, for example, the joint evaluation by at least some of the other autonomous technical systems shows that the status message is valid. Depending on the joint evaluation of the status message, a control rule is issued and sent to the first autonomous technical system AS1. The first autonomous technical system AS1 comprises a control module, to which the control rule can be sent and which, depending on commands of the control rule, controls the first autonomous technical system AS1. The first autonomous technical system AS1 can thus be externally controlled by a control rule, which was approved by a plurality of autonomous technical systems.

The monitoring by the monitoring autonomous technical system ASobs1 can, for example, be carried out continuously or at predetermined times. By way of example, the monitoring autonomous technical system can comprise at least one sensor, such as a camera, which continuously records the environment of the autonomous technical system. Furthermore, a status message can be evaluated by at least some of the other autonomous technical systems AS2 to AS9 continuously or at predetermined times. An abnormally behaving autonomous technical system can thus likewise be monitored or controlled continuously or at predetermined times. By way of example, a predetermined time may be the detection of abnormal operating behavior.

Figure 3:
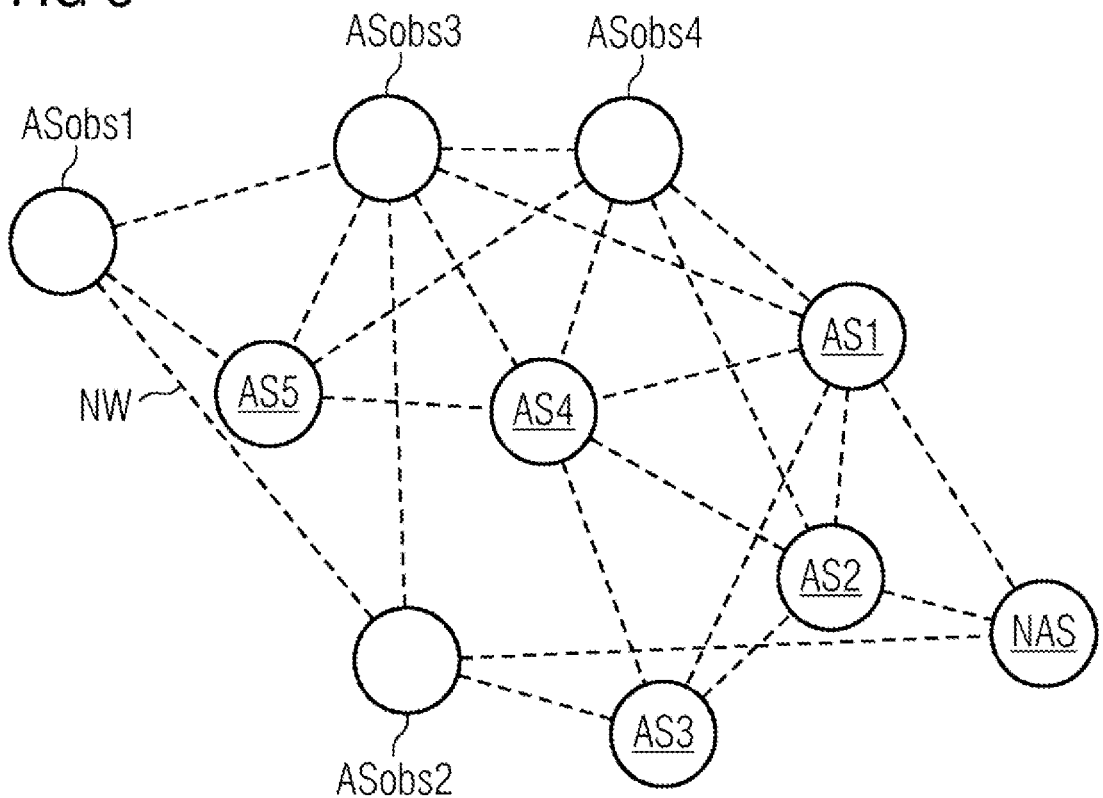
FIG. 3 shows a further schematic illustration of a method according to an embodiment of the invention.

FIG. 3 shows a communication network NW, via which several autonomous technical systems, AS1 to AS5, and several monitoring autonomous technical systems, ASobs1 to ASobs4, and a non-autonomous technical system NAS are interconnected. Each of the monitoring autonomous technical systems comprises at least one sensor and one monitoring module. Each of the autonomous technical systems can likewise comprise sensors and a monitoring module, wherein an autonomous technical system may be non-monitoring, i.e. the monitoring module and/or a sensor may be inactive. In particular, each of the autonomous technical systems can comprise a control module, such that external control in accordance with embodiments of the invention is possible in the event of abnormal operating behavior.

Each of the monitoring autonomous technical systems ASobs1 to ASobs4 can, independent of the others, monitor each of the other autonomous technical systems ASobs1 to ASobs4, AS1 to AS5 and can check, based on a first specified rule, whether one of them exhibits abnormal behavior. Each of the monitoring autonomous technical systems can generate a status message regarding the abnormal operating behavior of another autonomous technical system and send it to the respective other autonomous technical systems for evaluation. In particular, the status messages can be jointly evaluated if these, for example, concern the same autonomous technical system. By way of example, a weighting can be assigned to each of the monitoring autonomous technical systems, which weighting is, for example, dependent on the position of a monitoring sensor. One or several status messages can be jointly evaluated depending on the weighting. The weighting can in particular be predetermined, such as depending on a rank, e.g. road safety organization, or by an official body, or can be dynamically adjusted, if the monitoring quality changes owing to environmental conditions, for instance. A rank can, for example, describe a hierarchical level, such as a police car, a fire engine or ambulance, in the case of vehicles.

The non-autonomous technical system NAS can in particular comprise a control module according to embodiments of the invention, or a control module can be assigned thereto, and thus be connected to the communication network NW. The monitoring autonomous technical systems can assume the monitoring and control of the non-autonomous technical system NAS, wherein only the control module of the non-autonomous technical system NAS has to be designed in such a manner that control rules can be externally sent and implemented.

Figure 4:
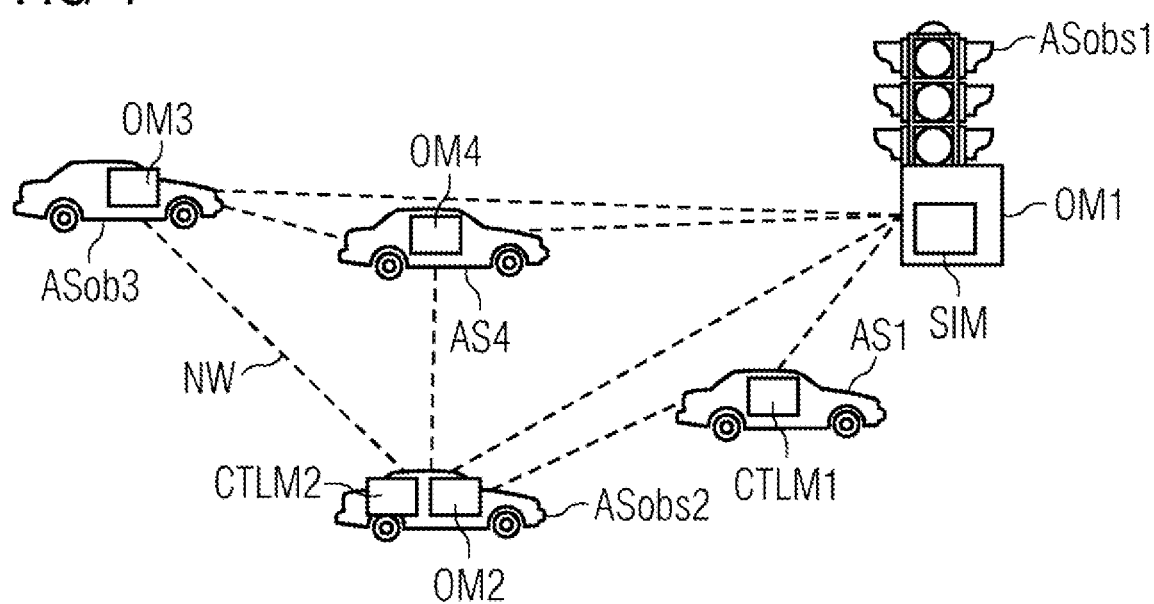
FIG. 4 shows a further schematic illustration of a method according to an embodiment of the invention.

FIG. 4 shows one scenario of the method according to embodiments of the invention by way of example. It shows a first autonomous technical system ASobs1 as a traffic regulation system, which comprises a first monitoring module OM1. By way of example, the first monitoring module OM1 is a camera or a speed sensor.

Autonomous vehicles AS1, ASobs2, ASobs3 and AS4 are also shown. The first autonomous vehicle AS1 only comprises a first control module CTLM1. The second autonomous vehicle ASobs2 is designed as a monitoring autonomous vehicle and comprises a second monitoring module CTLM2 and at least one sensor. The second autonomous vehicle ASobs2 also comprises a second control module CTLM2. The third autonomous vehicle ASobs3 is likewise designed as a monitoring autonomous vehicle and comprises a third monitoring module OM3. The fourth autonomous vehicle AS4 comprises a fourth monitoring module OM4, which may, for example, be inactive, i.e. the fourth autonomous vehicle cannot actively monitor other autonomous technical systems, but can, for example, participate in an evaluation of a status message. The autonomous vehicles are connected to each other via a communication network NW. In particular, the monitoring modules OM1 to OM4 each comprise an evaluation unit for evaluating a status message shared via the communication network NW.

In the exemplary embodiment shown, the first autonomous vehicle AS1 can be monitored by at least one of the other autonomous vehicles and/or the traffic regulation system. By way of example, the traffic regulation system ASobs1 can check, based on a speed measurement and a first rule, whether the first autonomous vehicle AS4 exhibits compliant behavior. By way of example, the traffic regulation system ASobs1 can determine, based on a speed measurement for the first autonomous vehicle AS1, that the latter exceeds a speed limit.

In particular, the first monitoring module OM1 can comprise a simulation unit SIM and determine a prediction about the operating behavior of the first autonomous vehicle AS1 by a computer-aided simulation. The traffic regulation system ASobs1 can, for example, extrapolate whether the first autonomous vehicle AS1 can come to a stop at a predetermined time based on the simulation.

The traffic regulation system ASobs1 can generate a status message regarding the operating behavior of the first autonomous vehicle AS1 based on these monitoring results and send it to the other autonomous vehicles ASobs2, ASobs3, AS4 via the communication network.

The other autonomous vehicles ASobs2, ASobs3, AS4 can receive the status message and evaluate it in the respective evaluation unit of the respective monitoring module OM2, OM3, OM4. By way of example, the second monitoring autonomous vehicle ASobs2 can check the status message of the traffic regulation system ASobs1 based on its own monitoring data and then evaluate it. An evaluation can also be made based on information from the status message itself, such as information on measurement uncertainties.

A control rule can be derived dependent on the joint evaluation by at least some of the other autonomous vehicles ASobs2, ASobs3, AS4. By way of example, the status message can be declared valid by a majority decision. A command to brake can, for example, be determined at a certain time based on the speed prediction by the simulation.

The derived control rule is sent to the control module CTLM1 of the first autonomous vehicle AS1. The first autonomous vehicle AS1 is monitored or controlled externally, depending on the control commands of the control rule. The first autonomous vehicle AS1 can, for example, be stopped, switched off or braked.

Figure 5:
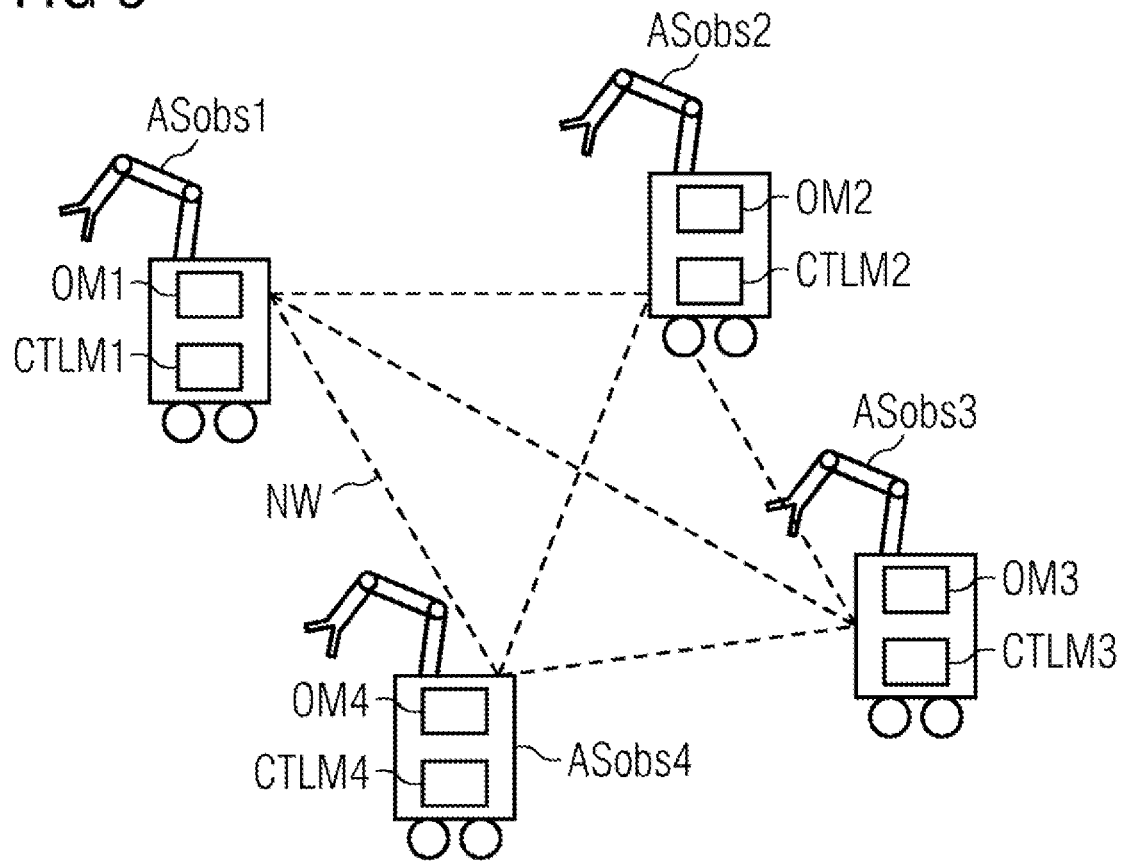
FIG. 5 shows a further schematic illustration of a method according to an embodiment of the invention.

FIG. 5 shows a further exemplary embodiment of a method according to embodiments of the invention. It shows autonomous robots, such as mobile industrial robots as autonomous technical systems ASobs1 to ASobs4. The robots ASobs1 to Asobs4 are respectively designed as monitoring autonomous technical systems. They are interconnected via the communication network NW. By the monitoring modules OM1 to OM4, the monitoring autonomous technical systems ASobs1 to Asobs4 can monitor each other's respective operating behavior. By way of example, abnormal operating behavior of one of the autonomous technical systems ASobs1 to ASobs4 can be detected by at least one of the other autonomous technical systems. By way of example, a robot ASobs4 may perform an abnormal action, such as not observing a predefined operating radius during a human-robot interaction, as a result of tampering or due to a malfunction. According to embodiments of the invention, a status message regarding the abnormal operating behavior of the robot ASobs4 can be sent via the communication network NW to other interconnected robots ASobs1 to ASobs3 and jointly evaluated by them. Depending on the evaluation, a control rule can be sent to the control module CTLM4 and implemented there according to embodiments of the invention. By way of example, the robot ASobs4 can be switched off or its operating radius limited. The method shown can in particular also be used for a human-robot interaction in order, for example, to reduce a danger posed to the human if one of the autonomous robots ASobs1 to ASobs4 malfunctions.

Figure 6:
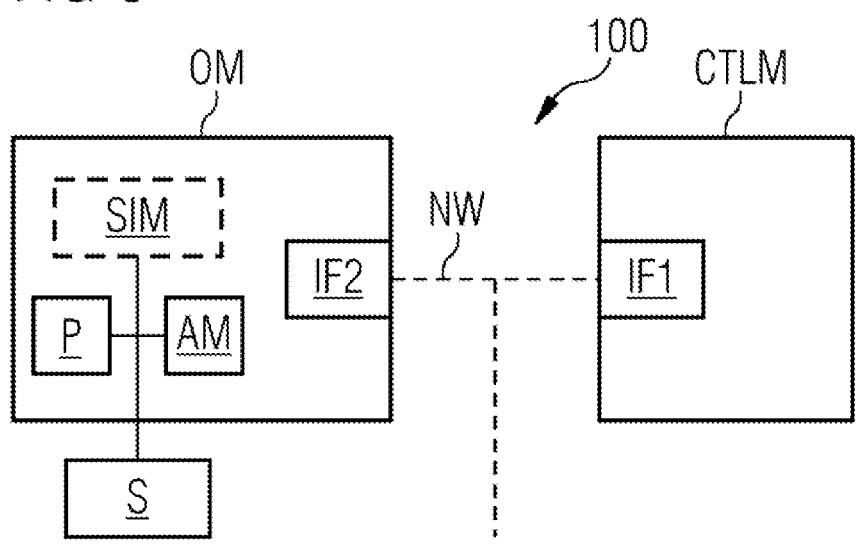
FIG. 6 shows a schematic illustration of a device according to an embodiment of the invention.

FIG. 6 shows, by way of example, an embodiment of a device 100 according to embodiments of the invention, comprising at least one monitoring module OM of an autonomous technical system and one control module CTLM of another autonomous technical system. The monitoring module OM and the control module CTLM are connected to one another via the communication network NW.

The control module and the monitoring module respectively comprise a first and second communication interface IF1 and IF2, which enables cryptographically encrypted data transmission. By way of example, the monitoring module OM can send an encrypted status message to other monitoring modules. In addition, a monitoring module OM can send an encrypted control rule to the control module CTLM, which can only be decrypted there.

The monitoring module OM is in particular coupled with at least one sensor S, e.g. permanently connected or interconnected via radio link. The sensor S can record sensor data and send it to the monitoring module OM. Based on the sensor data and a specified first rule, the monitoring module OM can determine whether, for example, another autonomous technical system exhibits abnormal operating behavior.

The monitoring module OM also comprises an evaluation unit AM, a simulation unit SIM and a processor P for carrying out at least one of the steps of a method according to embodiments of the invention. The evaluation unit AM is in particular assigned to the autonomous technical system and can, for example, comprise information on the weighting of an evaluation.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements.

The invention claimed is:

1. A method for mutual monitoring and/or control of a multiple, separate autonomous technical systems, which are at least partly interconnected via a communication network, the method comprising the following steps:

configuring at least one of the autonomous technical systems as a monitoring autonomous technical system and monitoring the operating behavior of other autonomous technical systems, detecting abnormal operating behavior of a first autonomous technical system of the autonomous technical systems by the monitoring autonomous technical system based on a specified first rule and a status message regarding the abnormal operating behavior of the first autonomous technical system is generated therefrom, the status message including an identification of the first autonomous system and details of the abnormal operating behavior of the first autonomous system, transmitting the status message from the monitoring autonomous technical system to a plurality of the other autonomous technical systems, wherein the status message is received by the plurality of the other autonomous technical systems and jointly evaluated by the plurality of the other autonomous technical systems and, depending on the joint evaluation, a control rule is derived for the first autonomous technical system, and sending the control rule to the first autonomous technical system, and the operating behavior of the first autonomous technical system is controlled according to the control rule, wherein a result of the joint evaluation is determined from a majority decision by the plurality of other autonomous technical systems or from weighted evaluations by the plurality of other autonomous technical systems, and the control rule is derived based on the result of the joint evaluation, and wherein the multiple, separate autonomous technical systems are autonomous vehicles or autonomous robots.

2. The method as claimed in claim 1, wherein the monitoring autonomous technical system comprises at least one sensor, the sensor records sensor data, and the abnormal operating behavior of first autonomous technical system is detected using the sensor data.

3. The method as claimed in claim 1, wherein several of the autonomous technical systems are configured as monitoring autonomous technical systems and each of these monitoring autonomous systems is configured to transmit a status message to other autonomous technical systems and the status messages are jointly evaluated.

4. The method as claimed in claim 1, wherein the monitoring of the other autonomous technical systems is carried out continuously and/or at predetermined times.

5. The method as claimed in claim 1, wherein a weighting is assigned to each autonomous technical system that evaluates the status message and the joint evaluation of the status message is determined from the weighted evaluations using the weightings.

6. The method as claimed in claim 5, wherein the weighting assigned to each autonomous technical system is dynamically adjusted depending on a monitoring quality and/or on a rank of the autonomous technical system.

7. The method as claimed in claim 1, wherein a computer-aided simulation of the operating behavior of another autonomous technical system is carried out by the monitoring autonomous technical system based on sensor data of the monitoring autonomous technical system and/or on sensor data of other monitoring autonomous technical systems and, based on the simulation, a prediction of future operating behavior is derived and transmitted as a status message to at least some of the autonomous technical systems.

8. The method as claimed in claim 7, wherein future, abnormal operating behavior is detected using the computer-aided simulation and a specified second rule, a status message is generated therefrom and this status message is transmitted to at least some of the autonomous technical systems.

9. A device for mutual monitoring and control of multiple, separate, autonomous technical systems, which are at least partly interconnected via a communication network, wherein the device is one of the autonomous technical systems, the device comprising:

a processor;
at least one sensor; and
at least one communication interface to the communication network;
wherein the device is configured to:
detect abnormal operating behavior of a first autonomous technical system of the autonomous technical systems based on a specified first rule and a status message regarding the abnormal operating behavior of the first autonomous technical system is generated therefrom, the status message including an identification of the first autonomous system and details of the abnormal operating behavior of the first autonomous system, transmit the status message from the monitoring autonomous technical system to a plurality of the other autonomous technical systems, wherein the status message is received by the plurality of the other autonomous technical systems and jointly evaluated by the plurality of the other autonomous technical systems and, depending on the joint evaluation, a control rule is derived for the first autonomous technical system, and send the control rule to the first autonomous technical system, and the operating behavior of the first autonomous technical system is controlled according to the control rule, wherein a result of the joint evaluation is determined from a majority decision by the plurality of other autonomous technical systems or from weighted evaluations by the plurality of other autonomous technical systems, and the control rule is derived based on the result of the joint evaluation, and wherein the multiple, separate autonomous technical systems are autonomous vehicles or autonomous robots.

10. The device as claimed in claim 9, wherein a first communication interface of the at least one communication interface is configured for receiving and decrypting encrypted data transfer.

11. The device as claimed in claim 9, wherein the device is configured to simulate operating behavior of another autonomous technical system, based on sensor data of the at least one sensor.

12. A non-transitory computer readable hardware storage device having computer readable program code stored therein, said program code executable by a processor of a computer system for mutual monitoring and/or control of a multiple, separate autonomous technical systems, which are at least partly interconnected via a communication network, the program code, when executed by the processor, causes the processor to perform the following steps:

configuring at least one of the autonomous technical systems as a monitoring autonomous technical system and monitoring the operating behavior of other autonomous technical systems, detecting abnormal operating behavior of a first autonomous technical system of the autonomous technical systems by the monitoring autonomous technical system based on a specified first rule and a status message regarding the abnormal operating behavior of the first autonomous technical system is generated therefrom, the status message including an identification of the first autonomous system and details of the abnormal operating behavior of the first autonomous system, transmitting the status message from the monitoring autonomous technical system to a plurality of the other autonomous technical systems, wherein the status message is received by the plurality of the other autonomous technical systems and jointly evaluated by the plurality of the other autonomous technical systems and, depending on the joint evaluation, a control rule is derived for the first autonomous technical system, and sending the control rule to the first autonomous technical system, and the operating behavior of the first autonomous technical system is controlled according to the control rule, wherein a result of the joint evaluation is determined from a majority decision by the plurality of other autonomous technical systems or from weighted evaluations by the plurality of other autonomous technical systems, and the control rule is derived based on the result of the joint evaluation, and wherein the multiple, separate autonomous technical systems are autonomous vehicles or autonomous robots.

13. The method as claimed in claim 1, wherein the status message is transmitted: (i) by encrypted data transmission via the communication network, and/or (ii) after mutual identification of the autonomous technical systems.

14. The method as claimed in claim 1, wherein the status message is jointly evaluated: (i) by encrypted data transmission via the communication network, and/or (ii) after mutual identification of the autonomous technical systems.

15. The method as claimed in claim 1, wherein the control rule is sent: (i) by encrypted data transmission via the communication network, and/or (ii) after mutual identification of the autonomous technical systems.

16. The device as claimed in claim 9, wherein at least some of the autonomous technical systems are configured as monitoring autonomous technical systems.

\* \* \* \* \*